United States Patent [19]
Gonzalez et al.

[11] Patent Number: 5,912,840
[45] Date of Patent: Jun. 15, 1999

[54] MEMORY CELL ARCHITECTURE UTILIZING A TRANSISTOR HAVING A DUAL ACCESS GATE

[75] Inventors: Fernando Gonzalez, Boise; David Kao, Meridian, both of Id.

[73] Assignee: Micron Technology, Boise, Id.

[21] Appl. No.: 08/916,117

[22] Filed: Aug. 21, 1997

[51] Int. Cl.$^6$ .................................................. G11C 16/04
[52] U.S. Cl. ............................. 365/185.05; 365/185.01; 365/161; 365/104; 365/175
[58] Field of Search ....................... 340/173; 365/185.28, 365/185.01, 185.23, 185.24, 87, 161, 104, 105, 175

[56] References Cited

U.S. PATENT DOCUMENTS

| | | | |
|---|---|---|---|
| 3,849,767 | 11/1974 | Shirato | 340/173 |
| 5,089,866 | 2/1992 | Iwasa | 357/23.5 |
| 5,511,020 | 4/1996 | Hu et al. | 365/185.28 |
| 5,569,946 | 10/1996 | Hong | 257/316 |
| 5,597,749 | 1/1997 | Iguchi | 437/43 |
| 5,600,593 | 2/1997 | Fong | 365/185.19 |

*Primary Examiner*—David Nelms
*Assistant Examiner*—Thong Le
*Attorney, Agent, or Firm*—Thorp, Reed & Armstrong

[57] ABSTRACT

A memory cell architecture utilizing a dual access gate and dual wordlines is disclosed. The cell is comprised of a first transistor connected between a digitline and a cellplate. The transistor is responsive to a read wordline to enable the cell to be read. An active device, such as a second transistor, is provided for modifying at least one conductive characteristic of the first transistor according to the state of a signal on the digitline. The conductive characteristic that is modified may be, for example, the threshold voltage or the transistor's channel resistance. Modification of the first transistor's characteristics is representative of writing information to the memory cell. A circuit structure for implementing the circuit architecture is also disclosed together with a method of operating a memory cell.

38 Claims, 4 Drawing Sheets

MEMORY CELL ARCHITECTURE UTILIZING A TRANSISTOR HAVING A DUAL ACCESS GATE

BACKGROUND OF THE INVENTION

1. Field of the Invention

The present invention is directed generally to memory cells and, more particularly, to dynamic random access memory cells fabricated utilizing ultra-large scale integration techniques.

2. Description of the Background

Prior art dynamic random access memories (DRAMs) utilize a variety of different circuit constructions. However, all DRAMs utilize a capacitor to store a charge representative of the information to be stored. For example, the capacitor may store a positive charge representative of a first logic level (a logic "one") with the absence of that positive charge interpreted as a second logic level (a logic "zero"). The capacitor can be accessed through a single transistor for both reading the charge stored on the capacitor or storing a charge on the capacitor. Consequently, DRAMs can operate at the very high clock speeds required by modern processors.

For each bit of information to be stored, a typical DRAM must provide a relatively large 25 ff capacitor. Although DRAM designers have been very clever in devising circuit architectures in which the capacitor is fabricated in a trench or stacked on top of other components so that the capacitor takes up less planer space, scaling the capacitor itself to smaller sizes represents a major challenge. Furthermore, the fabrication steps needed for such circuit architectures complicate the ultra-large scale integration processes used to fabricate such components.

One type of memory device that avoids the use of capacitors for storing charge is the flash memory. A flash memory relies upon a floating gate of a transistor to represent the state of each memory cell. For example, if the floating gate stores a charge such that upon the application of a voltage to the gate terminal the transistor is rendered conductive, that current may represent a first state. If the floating gate does not store any charge such that upon the application of a voltage to the transistor's gate terminal no current flows, the absence of such current may represent a second state. By using the capacitance of the floating gate to store the charge instead of a typical DRAM cell capacitor, flash memories can have a higher density and therefor a smaller size than similarly sized DRAMs. Flash memories are well know in the art as shown, for example, by U.S. Pat. No. 5,600,593 entitled Apparatus And Method For Reducing Erased Threshold Voltage Distribution In Flash Memory Arrays.

The floating gate in a flash memory is essential for the memory's non-volatile operation. However, because the gate is isolated to enable it to store charge and float, it is difficult to write to such devices. Essentially, the charge to be stored by the floating gate must be forced to tunnel through nonconductive dielectric material. As a result, flash memories cannot compete with DRAMs and static random access memories (SRAMs) in terms of speed performance.

A need exists for a memory device which does not rely on a large capacitor for storing charge while maintaining operating speeds substantially equal to those of state of the art DRAMs.

SUMMARY OF THE INVENTION

The present invention is directed to a memory cell having a dual access transistor and a dual wordline architecture. The cell is comprised of a first transistor connected between a digitline and a cellplate. The transistor is responsive to a read wordline to enable the cell to be read. An active device, such as a second transistor, is provided for controlling at least one conductive characteristic of the first transistor, e.g., the threshold voltage, channel resistance, etc. Controlling one of the first transistor's conductive characteristics is a way of writing information to the memory cell.

The memory cell of the present invention replaces the capacitor above the wordline in a standard DRAM with a high quality, thin film transistor (TFT) active device that connects a pseudo-floating gate of the first transistor to the digitline. Thus, charge is conducted to or from the pseudo-floating gate of the first transistor. As a result, the $I_{on}$ current of the TFT, which is higher than the tunneling currents found in flash memories, enables a faster write to the memory cell of the present invention than is possible in flash cells. It is anticipated that the TFT device must be a high quality device having at least approximately seven decades between $I_{on}$ and $I_{off}$.

The memory cell of the present invention uses two separate wordlines to control read/write cycles. One wordline, forming the gate of the TFT, is turned on only in the write cycle to charge or discharge the pseudo-floating gate according to the information on the digitline. The read wordline, which controls the first transistor, is turned on only in the read cycle. Depending upon the charge stored by the pseudo-floating gate, which has the effect of modifying a conduction characteristic of the first transistor, the drain to source current flow will either be on or off, thereby defining the state to the first transistor and hence the state of the memory cell.

According to another embodiment of the present invention, the pseudo-floating gate is implemented by one or more conductive spacers of the first transistor. The charged conductive spacers set up an inversion layer in the first transistor's channel which changes the channel resistance of the device. Again the $I_{on}$ current of the TFT, which is used to charge the spacers, is higher than tunneling currents found in flash memories such that the write to the spacers will be relatively fast. In this embodiment, as in the previous embodiment, two separate wordlines are used to control the read/write cycles. The write wordline, which forms the gate of the TFT, turns the TFT on only in the write cycle to control the charge on the conductive spacers. The read wordline is used only in the read cycle. Depending upon the channel resistance, the drain to source current flow will either be present or not present thereby setting the state of the memory device.

The memory cell of the present invention can be constructed in a smaller space than a similarly sized DRAM because the memory cell of the present invention eliminates the relatively large capacitor. The speed of the memory cell of the present invention is comparable to the speed of current state of the art DRAMs. Refresh is still required for most applications, but for the memory cells of the present invention, the refresh can be a low frequency refresh. The architecture of the present invention is scalable to the one gigabit level. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
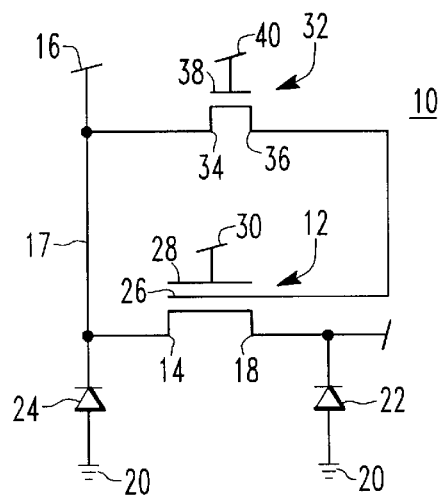
FIG. 1 is an electrical schematic illustrating an embodiment of a memory cell constructed according to the teachings of the present invention.
Figure 2:
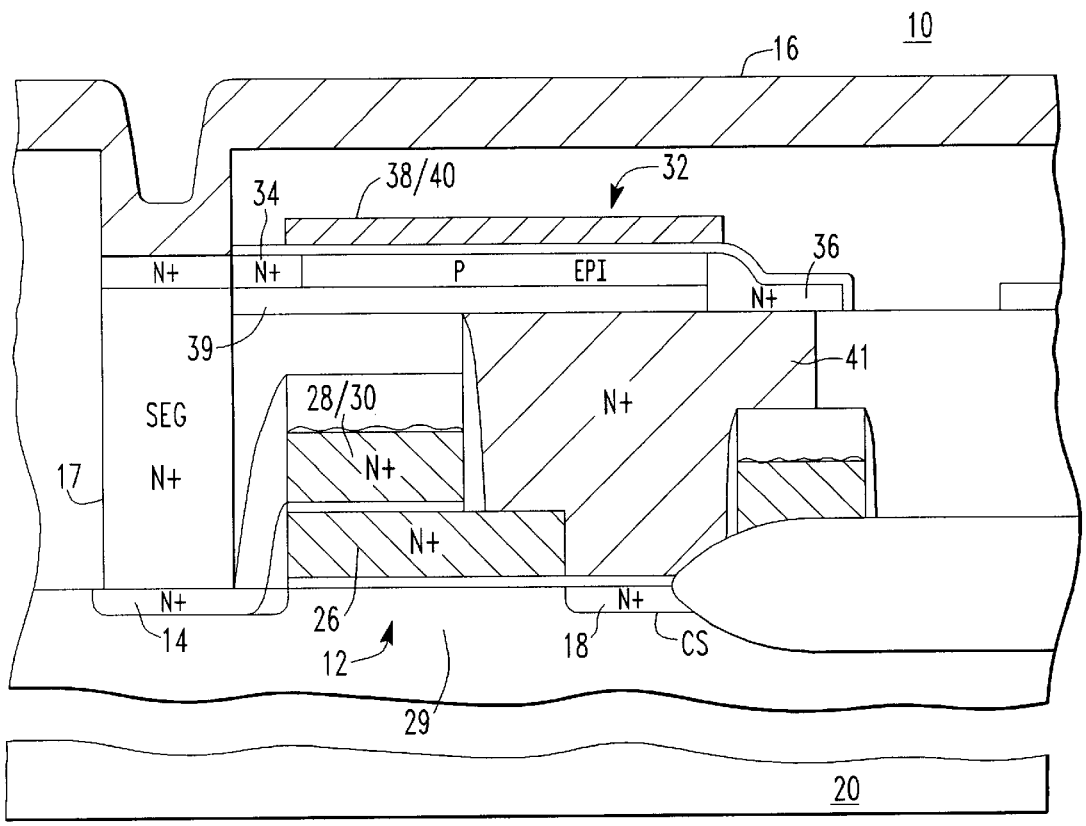
FIG. 2 illustrates an implementation of the memory cell shown in FIG. 1.

A first embodiment of a memory cell 10 constructed according to the teachings of the present invention will be described in connection with FIGS. 1 and 2. The memory cell 10 is illustrated as an electrical schematic in FIG. 1 and as a cross-sectional view of a fabricated device in FIG. 2. In FIG. 1, the memory cell 10 is comprised of a first transistor 12 having a first terminal 14 connected to a digitline 16 through a digitline contact 17 and a second terminal 18 connected to a cellplate 20 through a diode 22. The digitline contact 17 may also be connected to the cellplate 20 through a diode 24. The transistor 12 has a pseudo-floating gate 26 and a gate terminal 28 associated therewith. The transistor 12 is referred to as a dual access transistor because both the pseudo-floating gate 26 and the gate terminal 28 are fabricated above the first transistor's channel 29 as seen in FIG. 2. The gate terminal 28 is responsive to a read wordline 30.

The memory cell 10 is also comprised of an active device 32 which may be a second transistor. The second transistor 32 has a first terminal 34 connected to the digitline 16 through the digitline contact 17 and a second terminal 36 connected to the pseudo-floating gate 26. The second transistor 32 has a gate terminal 38 responsive to a write wordline 40.

The pseudo-floating gate 26 receives its name because, as seen in FIG. 2, it is not completely isolated by non-conductive material as is a true floating-gate. Rather, the pseudo-floating gate 26 is connected through a plug of conductive material 41 to the second terminal 36 of the second transistor 32. The purpose of the pseudo-floating gate 26 is to act as a storage node for storing charge. In the embodiment shown in FIGS. 1 and 2, the pseudo-floating gate is positioned so as to modify the threshold voltage of the first transistor 12. By positioning the pseudo-floating gate in other locations, other conduction characteristics can be modified as will be discussed hereinbelow in conjunction with other embodiments of the present invention.

In operation, the transistor 32 is responsive to a signal on the write wordline 40. When the signal available on the write wordline 40 causes transistor 32 to become conductive, the pseudo-floating gate 26 is connected to the digitline 16 through the second transistor 32 and the digitline contact 17. A write operation to the pseudo-floating gate 26 then occurs. If the signal available on the digitline is a high logic level, and if the charge already stored on the pseudo-floating gate 26 is representative of a high logic level, then no charge need be transferred. However, if the pseudo-floating gate is not charged to a state representative of a high logic level, then charge will flow from the digitline 16 to the pseudo-floating gate 26. Because there is a direct connection between the pseudo-floating gate 26 and the digitline 16, the transfer of charge occurs very efficiently such that the write operation takes approximately the same amount of time as a write operation in a typical DRAM cell.

Similarly, if the charge on the digitline is representative of a low logic level and the pseudo-floating gate 26 is already in a state representative of a low logic level, then no charge is transferred. However, if the pseudo-floating gate 26 is in a state representative of a high logic level, then charge flows from the pseudo-floating gate 26 to the digitline 16 through the second transistor 32 and the digitline contact 17. Again, because there is a direct conductive path between the pseudo-floating gate 26 and the digitline 16, the write operation occurs at speeds comparable to those found in DRAMs.

The purpose of the second transistor 32 is to control or modify the conductive characteristics of the transistor 12. In the embodiment shown in FIG. 1, that modification occurs by virtue of the fact that the second transistor 32 controls the charge stored by the pseudo-floating gate 26. That, in effect, changes the threshold voltage of the transistor 12. The threshold voltage of the transistor 12 can thus be modified so that the transistor can be easily turned on ("easy on") when the pseudo-floating gate 26 is charged, and cannot be turned on by the "normal" gate 28 ("hard off") when the pseudo-floating gate 26 is not charged.

Accordingly, during a read operation, the gate terminal 28 of the transistor 12 is responsive to a signal on the read wordline 30. If the pseudo-floating gate 26 is charged, the transistor 12 will be rendered conductive and the flow of current through transistor 12 will be recognized as, for example, a logic level one. If, however, the pseudo-floating gate 26 is not charged at the time when the read wordline 30 is activated, then the transistor 12 will not be rendered conductive such that no current will flow through the transistor 12 thereby indicating a logic level zero.

Those of ordinary skill in the art will recognize that the logic levels one and zero corresponding to conduction of the transistor 12 and non-conduction of the transistor 12, respectively, may be reversed. Similarly, the first and second terminals 14 and 18 of the transistor 12 may be a source and a drain, respectively, or a drain and a source, respectively, depending upon the fabrication process and the materials used. Such details of construction are not intended to limit the scope of the present invention.

To ensure that the pseudo-floating gate 26 is completely isolated from the digitline contact 17 and the digitline 16 when the second transistor 32 is nonconductive, it is desirable for the transistor 32 to be a high quality transistor. By high quality transistor, it is meant that the transistor's ratio of $I_{on}$ to $I_{off}$ must be at least seven decades or better. Eight or nine decades are preferred. Such characteristics can be obtained through the use of thin film transistors as will be described more fully hereinbelow in conjunction with FIG. 2.

The write drive current through the transistor 32 is on the order of, in one embodiment, $1\mu A$ to achieve 10 nS of write time on the cell while the FET sub-threshold current must be below 10 fA at 1 ff capacitance to give a five second refresh time. Although the read is a nondestructive read, it is anticipated that refresh will be required for many DRAM applications. Such refresh, however, may be a low frequency refresh. Because the defectivity of thin film transistors is lower than the diode leakage of a storage node in a standard DRAM, it is expected that the TFT will have a tight distribution about the five second static refresh range.

Referring to FIG. 2, to achieve the high quality TFT desirable for transistor 32, the presently preferred embodiment is to use an epitaxial silicon material that maintains a crystal lattice that is uniform with the crystal lattice of an SEG (Selective Epitaxial Growth) plug forming the digitline contact 17 which abuts the TFT. A seed layer 39 may be provided to help achieve the desired uniform crystal lattice. Another option is to make the TFT three dimensional thereby increasing the length of the transistor and making it easier to achieve the desired characteristics.

The present invention embodies not only the unique circuit architecture as shown in FIG. 1, but also the unique circuit structure as shown in FIG. 2. In FIG. 2, the portion of the read wordline 30 which overlays the channel 29 of the transistor 12 forms the gate 28 of the transistor 12. Hence the designation 28/30 in FIG. 2. It is seen that both the pseudo-floating gate 26 and the gate 28/30 are fabricated substantially above the channel 29. The portion of the write wordline 40 which overlays the p-channel of the transistor 32 forms the gate 38 of the transistor 32. Hence, the designation 38/40 in FIG. 2. The transistor 32 is fabricated substantially above the first transistor 12. The vertical plug 41 provides the conductive path between the pseudo-floating gate 56 and the second terminal 36 of the second transistor 32. The circuit structure illustrated in FIG. 2 scales according to the scalability of transistors and therefore is capable of providing a very dense circuit.

It is anticipated that the inventive concepts of the present invention will be implemented in a variety of ways. That is, the use of an active device to control the charge stored by a pseudo-floating gate acting as a storage node to thereby change a conductive characteristic of the first transistor may be implemented in a variety of ways. In FIG. 1, the pseudo-floating gate 26 is interposed between the normal gate 28 and the conductive channel 29 of the first transistor 12. Other embodiments will now be described.

Figure 3:
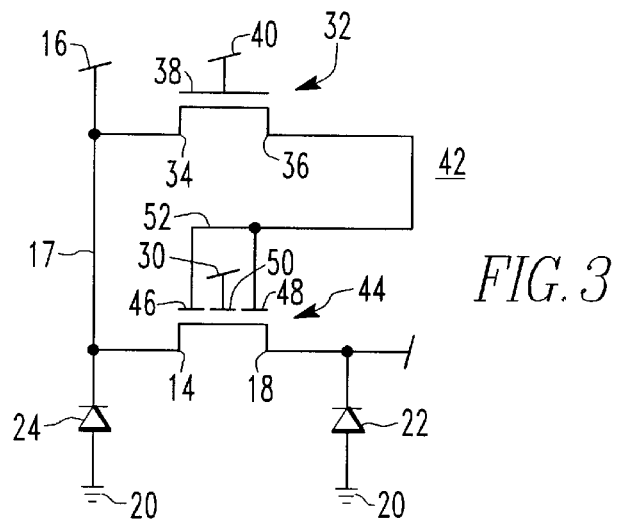
FIG. 3 is an electrical schematic illustrating another embodiment of a memory cell constructed according to the teachings of the present invention using conductive spacers.
Figure 4A:
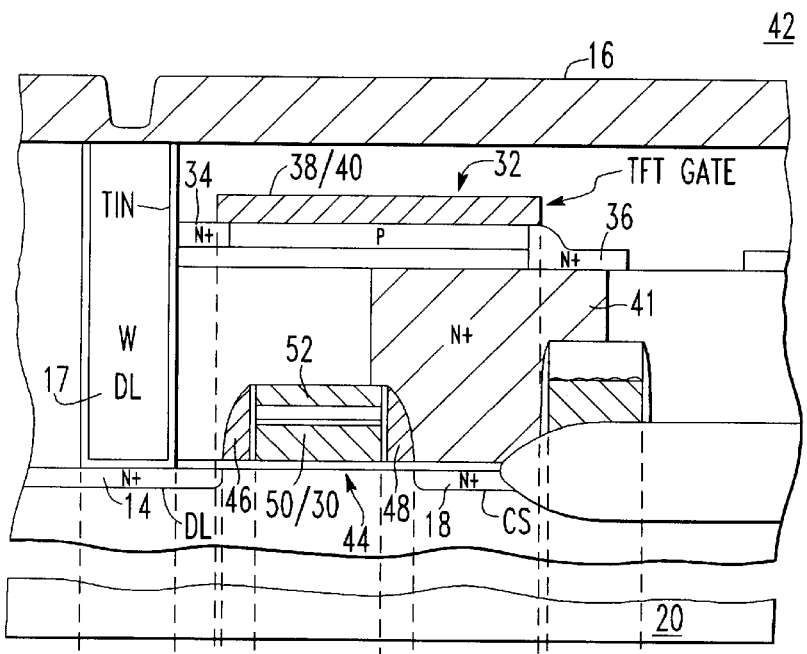
FIGS. 4A and 4B illustrate an implementation of the memory cell shown in FIG. 3.
Figure 4B:
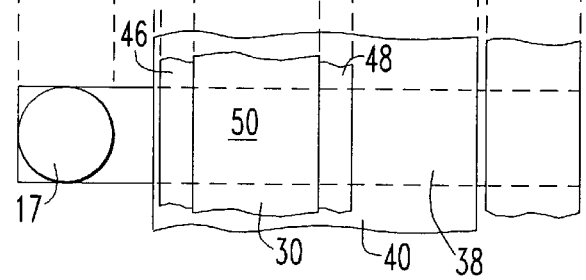

In FIG. 3, a memory cell 42 is illustrated. Where appropriate, the reference numerals used in FIG. 1 will be employed throughout the remaining figures to designate components performing an identical function as those in FIG. 1. In FIG. 3, memory device 42 is constructed in a manner similar to the memory device 10 of FIG. 1, except that the transistor 44 (FIG. 3) is constructed differently from the transistor 12 (FIG. 1). A cross-sectional view of the implementation of the circuit illustrated in FIG. 3 is illustrated in FIG. 4A, while FIG. 4B is a top view looking down on the implementation of FIG. 4A, with the digitline 16 removed.

In FIG. 3, the transistor 44 has a gate terminal 50 responsive to the read wordline 30. Located adjacent to both sides of the gate 50, and between terminals 14 and 18, are a first conductive spacer 46 and a second conductive spacer 48. The first and second conductive spacers 46 and 48, respectively, are connected together by a conductor 52. Each of the conductive spacers 46 and 48 acts as a pseudo-floating gate by virtue of the connection to the digitline 16 through the second transistor 32 and the fact that the n⁺material of terminals 14 and 18 does not extend under the conductive spacers 46 and 48, respectively, as shown in FIG. 4A. The first and second conductive spacers 46 and 48, respectively, have associated therewith a certain capacitance which enables each of the conductive spacers to act as a storage node. The charge stored by the conductive spacers 46 and 48 is controlled by the second transistor 32. By controlling the charge on the conductive spacers 46 and 48, the second transistor 32 is capable of modifying at least one conductive characteristic of the transistor 44. In the embodiment shown in FIG. 3, the characteristic which is modified is the channel resistance of the transistor 44.

The memory device 42 operates in the same manner as the memory device 10 of FIG. 1. That is, during a write cycle, the transistor 32 is conductive to thereby connect the conductive spacers 46 and 48 to the digitline 16 through the digitline contact 17. That allows the conductive spacers 46 and 48 to assume a state representative of the state of the digitline 16. Thereafter, during a read cycle, a signal on the read wordline 30 is applied to the gate terminal 50 of the transistor 44. If the conductive spacers 46 and 48 are charged, the voltage on the gate terminal 50 will be sufficient to cause the transistor 44 to be conductive, thereby indicating a first logic level. However, if there is no charge on the conductive spacers 46 and 48, the signal available at the gate terminal 50 will be insufficient to render the transistor 44 conductive, thereby indicating a second logic state. Thus, it is seen that the transistor 44 is "easy on" to indicate a first logic state and "hard off" to indicate a second logic state.

Figure 5:
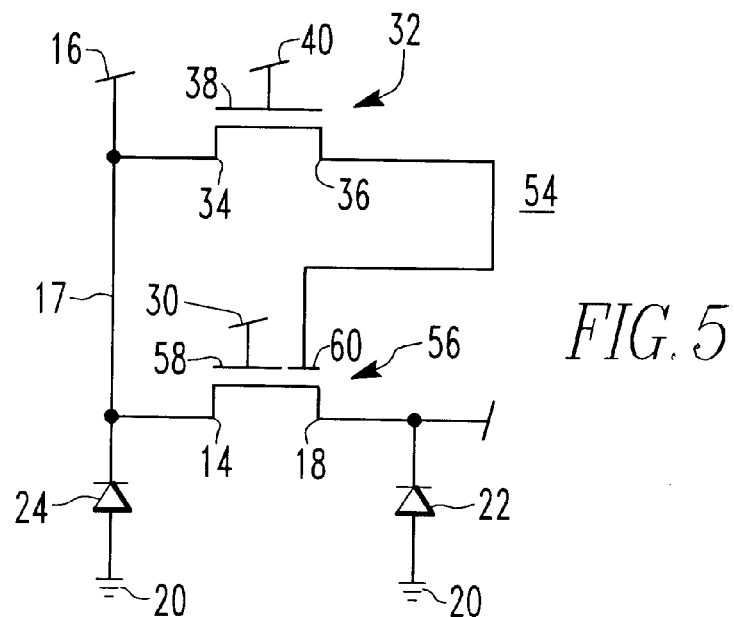
FIG. 5 is an electrical schematic illustrating another embodiment of a memory cell constructed according to the teachings of the present invention using a single conductive spacer.
Figure 6:
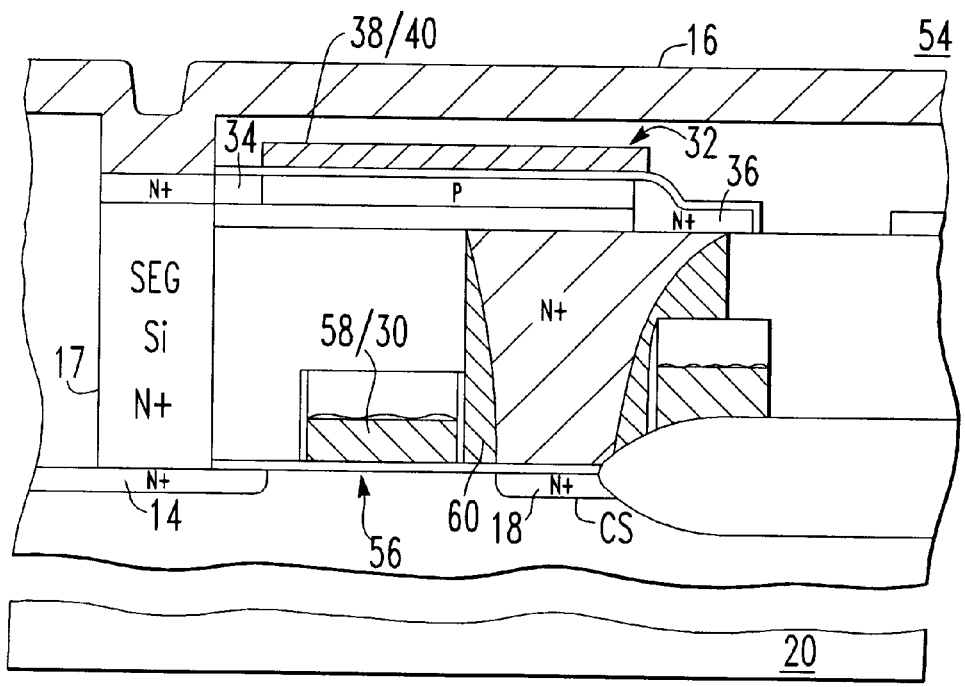
FIG. 6 illustrates an implementation of the memory cell shown in FIG. 5.

A further embodiment of the present invention is illustrated in FIGS. 5 and 6. In FIG. 5, a memory cell 54 operates in accordance with the principles previously discussed. However, a transistor 56 is fabricated in a manner differently from the transistors 44 (FIG. 3) and 12 (FIG. 1). In FIG. 5, the transistor 56 has a gate terminal 58 responsive to the read wordline 30 and a single conductive spacer 60 acting as a pseudo-floating gate terminal for storing charge. The memory cell 54 of FIG. 5 operates in a manner similar to that previously discussed.

The present invention is also directed to a method of writing to a memory cell comprising the steps of connecting a pseudo-floating gate of a first transistor to a digitline to allow the transistor's characteristics to assume a state related to the state of the signal on the digitline. The pseudo-floating gate is isolated from the digitline after the state related to the signal on the digitline is reached. That method may be implemented by utilizing a pseudo-floating gate of the type illustrated in FIG. 1, FIG. 3, or FIG. 5.

The present invention is also directed to a method of operating a memory cell by connecting the memory cell to a digitline in response to a write wordline and a read wordline. That method is comprised of the steps of activating the write wordline to connect the cell to the digitline for a write operation and activating the read wordline to connect the cell to the digitline for a read operation.

Figure 7:
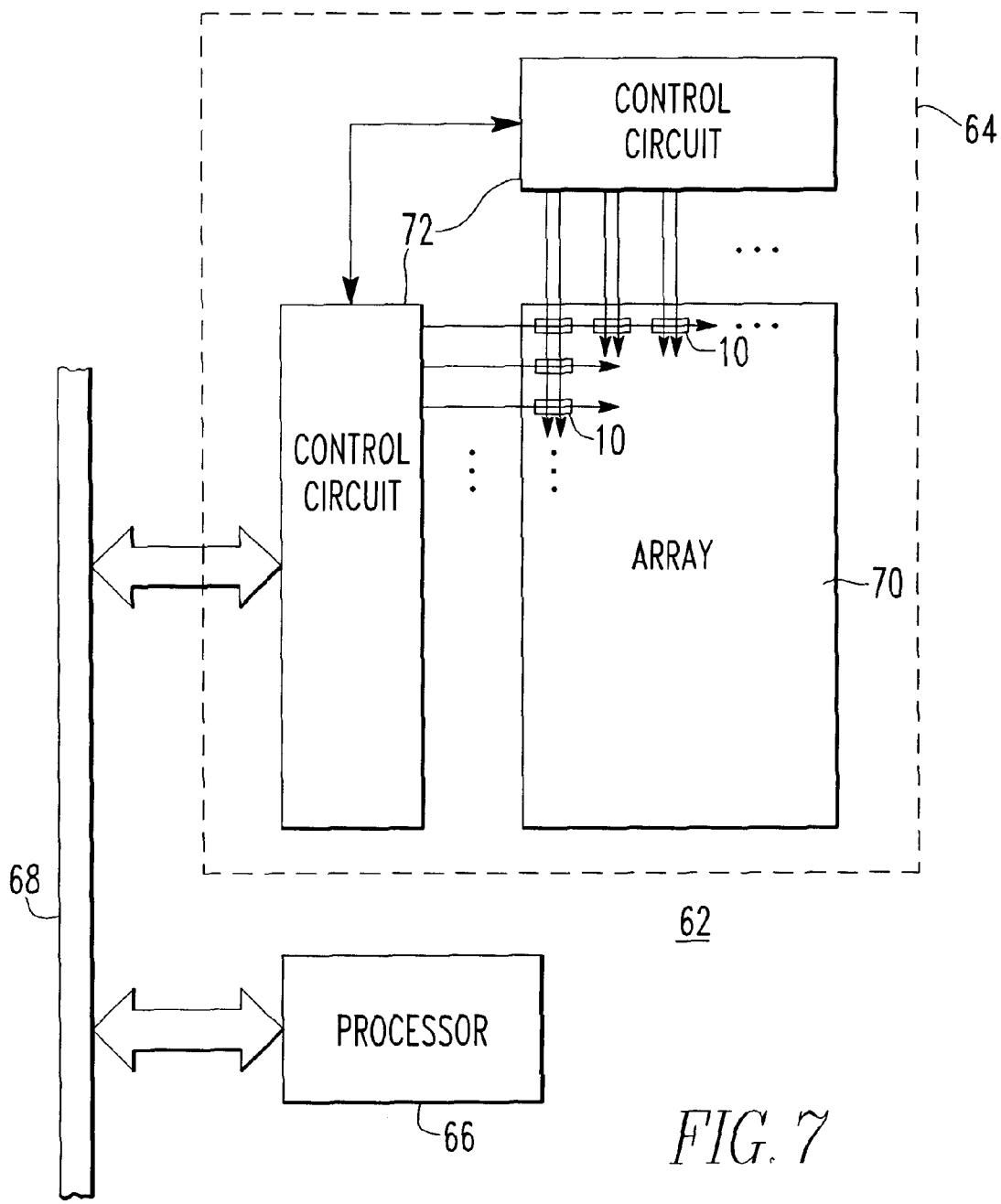
FIG. 7 illustrates a system including a memory device utilizing an array of memory cells constructed according to the teachings of the present invention.

Lastly, FIG. 7 illustrates a system 62 comprised of a memory device 64 under the control of a processor 66 through a bus 68. The system may be employed in any of a large number of devices which require the use of a processor 66 and one or more memory devices 64 for proper operation.

The memory device 64 is comprised of an array 70 of individual memory cells. The individual memory cells may be cells 10 of the type shown in FIG. 1, cells 42 of the type shown in FIG. 3, cells 54 of the type shown in FIG. 5, or some modification thereof. Control circuits 72 are provided for producing the signals known in the industry needed for writing information into and reading information out of the array 70.

The present state of the art has shown that flash cells are too slow to replace DRAMs and that the capacitor in DRAMs places limits on the density of the DRAM. The memory cell of the present invention enables a memory cell to be fabricated without a large capacitor. The memory cell of the present invention has fast write characteristics which are competitive with the write characteristics of traditional DRAMs. The memory cell of the present invention has high refresh times and is easily fabricated according to standard processes. The memory cell of the present invention is scaleable with the scalability of transistors. It also presents a low stack height and lower programming voltages than those found in flash cells. Thus, the present invention represents a substantial advance over the prior art.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A memory cell connected between a digitline, a write wordline, and a read wordline, comprising:
    a transistor connected between a digitline and a cellplate, said transistor being responsive to the read wordline; and
    a device for controlling at least one conductive characteristic of said transistor in response to said write wordline and the digitline.

2. The memory cell of claim 1 wherein said characteristic is a threshold voltage of said transistor.

3. The memory cell of claim 1 wherein said characteristic is a channel resistance of said transistor.

4. The memory cell of claim 1 wherein said transistor has a pseudo-floating gate, and wherein a charge stored by said pseudo-floating gate is controlled by said device.

5. The memory cell of claim 4 wherein said device includes a thin film transistor having an $I_{on}$ to $I_{off}$ ratio of at least approximately seven decades.

6. The memory cell of claim 4 wherein said pseudo-floating gate is positioned between a gate of said transistor and a channel of said transistor.

7. The memory cell of claim 4 wherein said pseudo-floating gate is positioned adjacent a gate of said transistor and above a channel of said transistor.

8. A memory cell having a dual access transistor, comprising:
    a transistor connected between a digitline and a cellplate, said transistor having a gate responsive to a first signal and a pseudo-floating gate; and
    an active device for controlling the charge stored by said pseudo-floating gate in a response to a second signal and the digitline.

9. The memory cell of claim 8 wherein said pseudo-floating gate is positioned between said gate and a channel of said transistor.

10. The memory cell of claim 8 wherein said pseudo-floating gate is positioned adjacent said gate and above a channel of said transistor.

11. The memory cell of claim 8 wherein said active device includes a thin film transistor having an $I_{on}$ to $I_{off}$ ratio of at least seven decades.

12. A memory cell having a dual wordline architecture, comprising:
    a first transistor defining a storage node, said transistor for connecting said memory cell to a digitline in response to a read wordline; and
    an active device for connecting said storage node to the digitline in response to a write wordline.

13. The memory cell of claim 12 wherein said storage node includes a pseudo-floating gate.

14. The memory cell of claim 12 wherein said storage node is positioned between a gate and a channel of said transistor.

15. The memory cell of claim 12 wherein said storage node is positioned adjacent a gate and above a channel of said transistor.

16. The memory cell of claim 12 wherein said active device includes a thin film transistor having an $I_{on}$ to $I_{off}$ ratio of at least approximately seven decades.

17. A memory cell structure, comprising:
    a substrate;
    a first transistor fabricated on said substrate, said transistor having first and second terminals defining a channel, said transistor having a pseudo-floating gate above said channel;
    a digitline contact in electrical contact with said first terminal;
    a portion of a read wordline fabricated to function as a gate for said first transistor;
    a second transistor fabricated substantially above said first transistor, said second transistor having a first terminal connected to said digitline contact and a second terminal connected to said pseudo-floating gate; and
    a portion of a write wordline fabricated to function as a gate for said second transistor.

18. The memory cell structure of claim 17 wherein said pseudo-floating gate is fabricated below said portion of said read wordline.

19. The memory cell structure of claim 17 wherein said pseudo-floating gate is fabricated adjacent said portion of said read wordline.

20. The memory cell structure of claim 17 wherein said pseudo-floating gate is fabricated adjacent both sides of said portion of said read wordline.

21. The memory cell structure of claim 17 wherein said second transistor is comprised of an epitaxial silicon material.

22. The memory cell structure of claim 21 wherein said digitline contact is comprised of a material having a substantially uniform crystal lattice, and wherein a crystal lattice of said epitaxial silicon material has substantially the same crystal lattice as said crystal lattice of said digitline contact material.

23. The memory cell structure of claim 22 wherein said second transistor includes a thin film transistor having an $I_{on}$ to $I_{off}$ ratio of at least approximately seven decades.

24. An array of memory cells, fabricated on a substrate comprising:
    a digitline;
    a write wordline;
    a read wordline; and
    a plurality of memory cells, each cell comprising:
        a transistor connected between said digitline and a cellplate, said transistor being responsive to said read wordline; and
        an active device responsive to said write wordline for controlling at least one conductive characteristic of said transistor in response to said read wordline and said digitline.

25. The array of claim 24 wherein said active device controls a threshold voltage of said transistor.

26. The array of claim 24 wherein said active device controls a channel resistance of said transistor.

27. The array of claim 24 wherein said active device includes a thin film transistor having an $I_{on}$ to $I_{off}$ ratio of at least approximately seven decades.

28. The array of claim 24 wherein said transistor has a pseudo-floating gate, and wherein a threshold voltage of said transistor is controlled by said active device controlling a charge stored by said floating gate.

29. The array of claim 28 wherein said active device includes a second transistor having a first terminal connected to said digitline, a second terminal connected to said pseudo-floating gate, and a control terminal responsive to said write wordline.

30. The array of claim 29 wherein said second transistor has an $I_{on}$ to $I_{off}$ ratio of at least approximately seven decades.

31. The array of claim 24 wherein said transistor has a pseudo-floating gate, and wherein a channel resistance of said transistor is controlled by said active device controlling a charge stored by said pseudo-floating gate.

32. The array of claim 31 wherein said active device includes a second transistor having a first terminal connected to said digitline, a second terminal connected to said pseudo-floating gate, and a control terminal responsive to said write wordline.

33. The array of claim 32 wherein said second transistor has an $I_{on}$ to $I_{off}$ ratio of at least approximately seven decades.

34. A method of writing to a memory cell, comprising:
   connecting a pseudo-floating gate of a first transistor to a digitline to allow the transistor's conduction characteristics to assume a state related to a signal on the digitline; and
   isolating said pseudo-floating gate from said digitline after said state related to the signal on the digitline is reached.

35. A method of operating a memory cell connected to a digitline in response to a first wordline and a second wordline, comprising:
   activating the first wordline to connect the cell to the digitline through an active device for a first operation; and
   activating the second wordline to connect a storage node of the cell directly to the digitline for a second operation.

36. The method of claim 35 additionally comprising the step of activating the write wordline to connect the cell to the digitline for a refresh operation.

37. A memory device fabricated on a substrate, comprising:
   a digitline;
   a write wordline;
   a read wordline;
   a plurality of memory cells, each cell comprising:
      a transistor connected between said digitline and a cellplate, said transistor being responsive to said read wordline; and
      an active device responsive to said write wordline and said digitline for controlling at least one conductive characteristic of said transistor; and
   control circuits for writing information into and reading information out of said plurality of memory cells.

38. A system comprising:
   a microprocessor; and
   a memory device comprising:
      a digitline;
      a write wordline;
      a read wordline;
      a plurality of memory cells, each cell comprising:
         a transistor connected between said digitline and a cellplate, said transistor being responsive to said read wordline;
         an active device responsive to said write wordline sand said digitline for controlling at least one conductive characteristic of said transistor; and
      control circuits for writing information into and reading information out of said plurality of memory cells.

* * * * *